United States Patent [19] [11] 3,975,696
Kantorowicz [45] Aug. 17, 1976

[54] ACOUSTIC STORAGE DEVICE FOR THE CORRELATION IN PARTICULAR OF TWO HIGH FREQUENCY SIGNALS

[75] Inventor: Gerard Kantorowicz, Paris, France
[73] Assignee: Thomson-CSF, Paris, France
[22] Filed: May 29, 1975
[21] Appl. No.: 581,749

[30] Foreign Application Priority Data
June 4, 1974  France .............. 74.19172

[52] U.S. Cl. .............. 333/30 R; 235/181; 310/9.8; 333/72
[51] Int. Cl.² .............. H03H 9/26; H03H 9/30; G06G 7/19; H01L 41/10
[58] Field of Search .............. 333/30 R, 72, 70 T; 235/181; 310/8, 8.1, 8.2, 9.8; 340/173.2; 367/221 R, 221 C, 221 D

[56] References Cited
UNITED STATES PATENTS
| | | |
|---|---|---|
| 3,675,140 | 7/1972 | Fang et al. .............. 330/5.5 |
| 3,691,406 | 9/1972 | Mize .............. 333/72 X |
| 3,792,321 | 2/1974 | Seifert .............. 317/235 R |
| 3,826,932 | 7/1974 | Wang .............. 310/8.1 |
| 3,833,867 | 9/1974 | Solie .............. 333/30 R |
| 3,851,280 | 11/1974 | Staples .............. 333/30 R |

Primary Examiner—Alfred E. Smith
Assistant Examiner—Marvin Nussbaum
Attorney, Agent, or Firm—Roland Plottel

[57] ABSTRACT

Solid-state diodes constituted by a semiconductor 3 and an insulated electrode 1 are aligned upon a piezoelectric substrate 4 at the surface of which there propagate the acoustic waves induced by the signals applied to transducers 7 and 8. With each diode there is associated a capacitor whose dielectric is constituted by a portion of the substrate 4; 9 designates the terminals of the electrodes 2 and 5 between which a voltage pulse is applied, in order to charge up the capacitors, after a first high frequency signal has been applied to the transducer 7. Thus, there is stored the high frequency signal at the terminals of the capacitor. During discharge of the capacitor, a second signal is applied to one of the transducers 7 or 8. At 9, there is picked off either the correlation or the convolution of the stored signal and the second signal.

9 Claims, 4 Drawing Figures

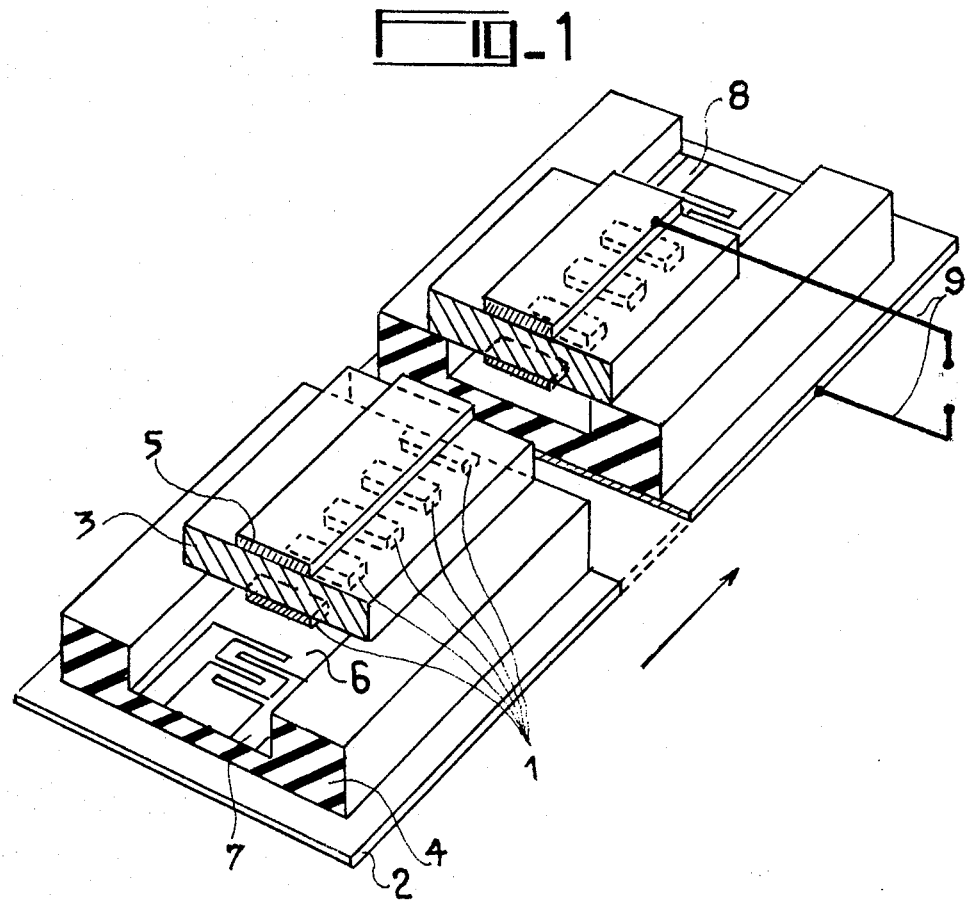
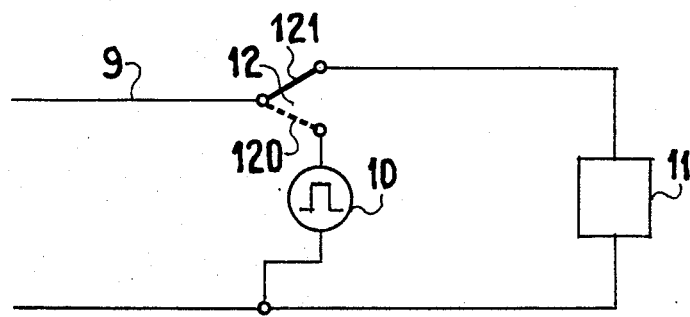

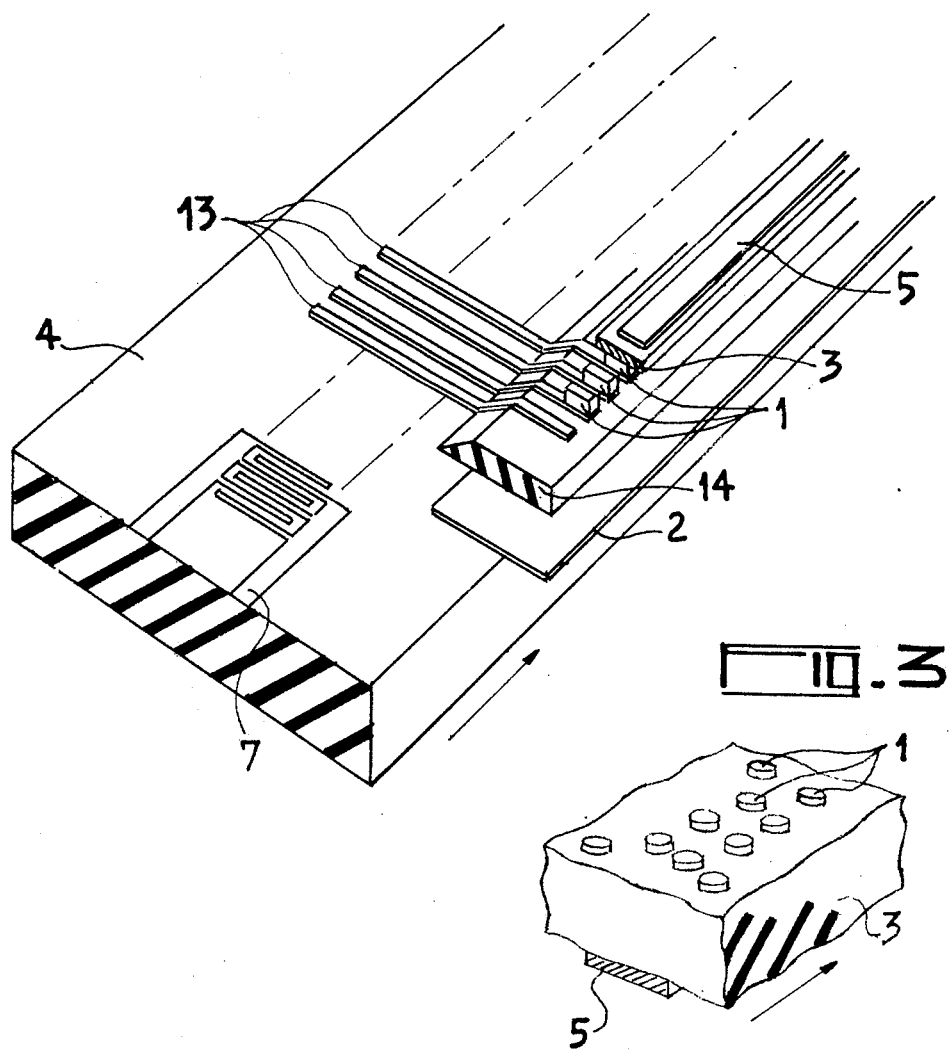

ACOUSTIC STORAGE DEVICE FOR THE CORRELATION IN PARTICULAR OF TWO HIGH FREQUENCY SIGNALS

The present invention relates to an acoustic storage device for processing high frequency signals, in particular for the correlation and convolution of two signals.

Devices comprising a series of elementary cells each constituted by a capacitor and a solid-state diode arranged in series, can be utilised to store high frequency signals, in particular radio signals, applied by an insulating transducer possessing piezoelectric properties associated with the capacitors. A short direct voltage pulse applied to the terminals of the end electrodes of the assembly of diodes and capacitors, after the application of the high frequency signal, causes the insulated electrodes of the diodes to be charged up to a voltage proportional to the sum of the pulse voltage and that corresponding to the signal applied to the terminals of the transducer. After the disappearance of the pulse, between said terminals there is available a signal corresponding to the applied signal throughout the whole of the time taken for the capacitors to discharge across the reverse-operated diodes. This time, which can be varied through the agency of the diode characteristics, is the storage time of the device.

In one of their embodiments, these devices take the form shown in FIG. 1 where 3 and 1 respectively illustrate a rod of a semiconductor substance and insulated metal electrodes, constituting in association with the underlying part of the semiconductor, the diode referred to earlier. In this figure, the reference 4 designates a piezoelectric substrate which is an electrical insulator, in contact with the semiconductor 3 and constituting the dielectric of the series of capacitors associated with each of the aforesaid diodes, 2 and 5 designate the two end electrodes, 9 designates their terminals and 7 and 8 designate the transducers applied to the substrate 4 at each of the ends thereof.

In accordance with the invention, these devices are utilised for example to compare, and especially to correlate and convolute, two signals, under the conditions which will be specified hereinafter making reference to:

FIG. 1, which is a perspective view of one variant embodiment of the device of the invention;

FIG. 2, which is a complement of the latter;

FIG. 3, which is a perspective view of another variant embodiment of the device in accordance with the invention and FIG. 4, which shows a fragment of another embodiment of the devices of the device of the invention.

After having stored the high frequency electrical signal applied to the left-hand transducer 7, under the conditions specified hereinbefore and explained in more detail hereinafter, there is applied to the same transducer, during the time of discharge of the capacitors, a second high frequency signal which gives rise to a potential wave propagating in the direction of the arrow over the piezoelectric body.

The non-linear superimposition of the two signals leads to the appearance at the terminals 9 of the electrodes 2 and 5, of a resultant signal representing the correlation of said second signal and that, constituting the reference signal, which is stored. By applying the second signal to the right-hand transducer 8, it is the convolution between said signal and the reference signal, which appears at the terminals 9. Using a second short signal, the stored signal can be made to re-appear across the terminals 9.

In the following, we shall consider again the conditions governing the store function.

Considering an n-doped semiconductor in which the negatively charged free charge carriers are constituted by electrons, a positive voltage applied at a given instant between electrode 5 and electrode 2, of positive potential, results in the displacement of free electrons towards the insulated electrode 1 which latter charges up under the effect of this electron transfer; the time constant of this charging mechanism depends upon the conductivity of the semiconductor 3 and may be very short if said conductivity is high. The voltage developing across the terminals of the capacitor is proportional to the applied voltage. For a p-doped semiconductor, unlike the n-doped semiconductor referred to earlier, the same charging phenomenon would occur for an applied voltage of opposite sign to the former.

After the pulse, the insulated electrode is charged up to the voltage developed across the terminals of the capacitor, the diode is at this time reverse-operated; the capacitor discharges across the diode which is in series with it and which has a very high resistance because it is being operated in the reverse direction.

If, now, after the high frequency signal to be stored has been applied to the transducer 7 and after the time required for the acoustic wave corresponding to it to have reached all the diodes, the contact electrode 5 of the semiconductor is negatively biased by a voltage pulse of short duration, compared with the periodicity of the signal across the terminals 9, then the diodes will be biased positively; their insulated electrodes will rapidly charge to a voltage proportional to the sum of the voltage pulse and the voltage corresponding to the high frequency signal, which voltage results from the potential wave accompanying the acoustic wave corresponding to the high frequency signal and propagating at the surface of the piezoelectric substrate.

It is through these potential waves that the device manifests the presence of a high frequency signal applied to the input across the terminals of the transducer 7. These waves propagate at the surface of the piezoelectric body in the direction of the arrow, which direction is also that of the line of electrodes 1.

The voltage across the terminals of the capacitors, it too being proportional to said sum in accordance with what has been said earlier, is a function of the applied high frequency signal. In respect of each of the capacitors, it is a function of the high frequency component at the location of the particular associated diode.

Thus, during this phase of operation of the device, the high frequency signal has been stored during the whole of the discharge time of the capacitors, the length of which time is determined primarily by the reverse resistance of the diode. Because of the high resistance of the diode, using this device long-term stores are created, giving storage times currently in the order of some few hundreds of milliseconds to some few seconds.

FIG. 2 illustrates the means provided in accordance with the invention, between the terminals 9 of the Figure. These means consist of a source 10 producing short pulses used to store the reference signal, a load 11 across which the resultant signal is picked off in particular for read-out, and a switch 12 the position 120 of which corresponds to storage and the position 121 of which corresponds with the picking off of the resultant signal. The read-out function is non-destructive; it remains possible to effect read-out throughout the whole time of discharge.

The terms short pulse and short signal are intended to signify pulses and signals of short duration by comparison with the periodicity of the high frequency stored signal.

In the example of FIG. 1, the semiconductor elements of each of the diodes of the device are combined into a single rod 3. This arrangement, although not essential, is a particularly convenient embodiment of the invention. In another variant embodiment of the invention, these diodes are separated from one another by intervals of the order of one third of the acoustic wavelength of the high frequency signals.

In another variant embodiment of the invention, the electrodes 1 are randomly distributed on a semiconductor 3 in a manner shown fragmentarily in FIG. 3, their dimensions and spacings being small compared with the wavelength involved.

In the example of FIG. 1, the recess 6 in the piezoelectric substrate 4 is designed to prevent damping of the acoustic waves which could occur if there were a large area of contact between the solid 3 and the substrate 4. The depth of this recess is small by comparison with the wavelength of the acoustic waves.

In the variant embodiment of FIG. 1, the coupling between the semiconductor 3 and the piezoelectric substrate 4 is effected by the capacitance between these two components which are arranged opposite one another. However, it may be sought to reduce the thickness of the insulating portion 4 in order, other things being equal, to increase the discharge time constant of the capacitors, that is to say the storage time, and at the same time to reduce the voltage of the pulse. There is a limit to the extent to which this avenue can be pursued, governed by the need to provide a sufficiently thick piezoelectric substrate not to disturb the propagation of the acoustic waves at its surface.

The variant embodiment shown in FIG. 4 is designed to overcome this difficulty.

In this variant embodiment, in which the same references designate the same elements as in FIG. 1, the potential profile is transmitted from the surface of the piezoelectric body 4 to the insulated electrodes 1, by a network of conductive bands 13 applied to the substrate 4 and each in contact with an electrode 1, as shown in the drawing; in this case, the reference 14 designates a layer of an electrical insulator which completes the capacitors; this layer is in contact with the electrodes 1 on the one hand and with the electrode 2 on the other; in the variant embodiment of the figure it is a one-piece item like the semiconductor 3 but as pointed out in relation to FIG. 1, the diodes could be separate from one another. The layer 14, in the case of the variant embodiment shown is separate from the substrate 4 it can be said; it was integral therewith in the variant embodiment of FIG. 1.

Finally, in the variant embodiment of FIG. 4, the electrode 2 in contact with the layer 14 is also in contact with the substrate 4, this contact is unnecessary in this variant embodiment of the invention, which likewise covers the case in which the plate 2 is located at a certain distance from the piezoelectric body 4.

The significance of the storage of the reference signal resides in the fact that it is possible to perform the convolution or correlation of the second signal with a previously chosen signal, in particular with the signal which has been stored at the time of emission, in a situation where said second signal is that received by a radar. Correlation then makes it possible to filter the received signal from the parasitic signals which would be superimposed upon it during its trajectory, or at any rate from part of these. The device operates as a tuned filter and improves the signal-to-noise ratio.

What is claimed is:

1. An acoustic device for high frequency signals, constituted by a network of cells each made up of a capacitor and a semiconductor diode in series with one another, said diode being formed by an insulated electrode applied to one of the faces of a semiconductor and placed between two electrodes the first of which is applied directly on that face of said semiconductor which is opposite to the one on which the insulated electrode is applied, and the second of which is applied to a layer of an electrically insulating material arranged opposite said insulated electrode and opposite that face of said semiconductor to which said electrode is applied, said insulated electrode and said second electrode constituting the electrodes of said capacitor, said acoustic device being characterised in that it furthermore comprises a piezoelectric body and transducers applied to one of the faces thereof, from which transducers acoustic surface waves propagate when high frequency signals are applied to their terminals; in that said insulated electrodes of said network of diodes are distributed in the direction of propagation of said surface acoustic waves generated by said transducers at the face of said piezoelectric body; and in that said acoustic device comprises means for coupling that face of said piezoelectric body on which said acoustic waves propagate, to said insulated electrodes of said diodes of the network, as well as means for successively connecting between said first and second electrodes after the appearance of a first high frequency signal at one of said transducers, a source of voltage pulses which charge up said capacitors, and a load, said device ensuring that there is picked off across said load, during the whole of the time of the discharge of said capacitors, a signal resulting from the superimposition of the first signal and a second signal applied to one of said transducers after the application of said pulse.

2. An acoustic device as claimed in claim 1, characterised in that said second signal is applied to the same transducer to which the first signal is applied, said superimposition producing the correlation between the two signals.

3. An acoustic device as claimed in claim 1, characterised in that said second signal is applied to a transducer located opposite to the first in the direction of said propagation, said superimposition furnishing the convolution between the two signals.

4. An acoustic device as claimed in claim 1, characterised in that said second signal is a short signal, said device reconstituting said first signal across said load.

5. An acoustic device as claimed in claim 1, characterised in that said layer of electrically insulating material consists of said piezoelectric body.

6. An acoustic device as claimed in claim 5, characterised in that said semiconductor consists of a rod extending in said direction of propagation.

7. An acoustic device as claimed in claim 6, characterised in that said piezoelectric body contains a recess in that of its portions located opposite said insulated electrodes.

8. An acoustic device as claimed in claim 1, characterised in that means consist of a network of parallel conductive bands which are applied, at one of their ends, to that face of the piezoelectric body at which said propagation takes place, and are each in contact at their other end with one of said insulated electrodes.

9. An acoustic device for high frequency signals as claimed in claim 6, characterised in that said insulated electrodes are randomly distributed over said rod.

* * * * *